United States Patent
Hsu et al.

(12)

(10) Patent No.: US 6,343,044 B1
(45) Date of Patent: Jan. 29, 2002

(54) SUPER LOW-POWER GENERATOR SYSTEM FOR EMBEDDED APPLICATIONS

(75) Inventors: Louis Lu-Chen Hsu, Fishkill, NY (US); Richard Michael Parent, Shelburne, VT (US); Matthew R. Wordeman, Makawao, HI (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/679,124

(22) Filed: Oct. 4, 2000

(51) Int. Cl.[7] .................................................. G11C 7/00
(52) U.S. Cl. .................. 365/227; 365/229; 365/189.09; 365/230.06
(58) Field of Search ................................ 365/227, 226, 365/229, 189.09, 189.11, 230.06

(56) References Cited

U.S. PATENT DOCUMENTS

| | | | |
|---|---|---|---|
| 4,961,007 A | | 10/1990 | Kumanoya et al. |
| 4,961,167 A | * | 10/1990 | Kumanoya et al. .... 365/189.09 |
| 5,337,284 A | | 8/1994 | Cordoba et al. |
| 5,570,005 A | | 10/1996 | Hardee et al. |
| 5,781,481 A | * | 7/1998 | Iwakiri .............. 365/189.09 X |
| 5,886,932 A | | 3/1999 | Choi |
| 5,886,942 A | * | 3/1999 | Akita .................... 365/230.06 |
| 5,926,427 A | * | 7/1999 | Kim ........................ 365/226 X |
| 6,262,934 B1 | * | 7/2001 | Uehara .................. 365/230.06 |

OTHER PUBLICATIONS

"A Self–Off–Time Detector for Reducing Standby Current of DRAM", by Ho–Jun Song, IEEE Journal of Solid–State Circuits, vol. 32, No. 10, Oct. 1997, pp. 1535–1542.

"A Novel Power–Off Mode for a Battery–Backup DRAM", by Daisaburo Takashima, et al., IEEE Journal of Solid–State Circuits, vol. 32, No. 1, Jan. 1997, pp. 86–91.

\* cited by examiner

*Primary Examiner*—Huan Hoang
(74) *Attorney, Agent, or Firm*—Scully, Scott, Murphy & Presser; Todd M. C. Li

(57) ABSTRACT

A system and method for considerable reduction of power consumption in memory circuits implementing Vbb (array body bias) and Vwl (negative word line) voltage generators. The system comprises switching off the negative WL generator during sleep or standby mode, so that no power is consumed. A relaxed refresh operation is carried out and the negative WL is powered by the Vbb generator. The noise coupled to the negative WL supply from BL swing is reduced due to the joint Vbb-Vwl decoupling scheme. In the active mode, the Vbb and Vneg are separated to avoid any cross-over noise and to maintain design flexibility. During power-on period, the ramp-up rate of Vbb level is improved by the Vwl generator. The advantages may be summarized as: (1) simpler Vbb generator design, (2) much smaller Vbb generator size, (3) reduced Vbb power, (4) no stand-by current from Vwl generator, (5) low decoupling noise for Vwl level during stand-by or sleep mode, (6) enhanced ramp-up rate for Vbb during power-on, (7) no cross-over noise between Vbb and Vwl during active mode, and (8) design flexibility of Vbb and Vwl in the active mode. The principles and advantages of the invention may be applied to any two or more DC generator systems, negative or positive.

18 Claims, 9 Drawing Sheets

SUPER LOW-POWER GENERATOR SYSTEM FOR EMBEDDED APPLICATIONS

BACKGROUND OF THE INVENTION

1. Field of the Invention

This invention relates generally to memory circuits, and more specifically, to a memory circuit system and architecture for significantly reducing power consumption during stand-by or sleep mode of operation.

2. Discussion of the Prior Art

Negative Word-line (Vwl) generators are used in today's integrated circuit semiconductor memory chips in order to hold all non-selected word-lines of memory array at a negative potential. The purpose is to reduce cell leakage and improve the retention time. During stand-by, or sleep mode, voltage generators consume energy. One proposal in the art, as described in the reference to D. Takashima, Y. Oowaki et al. entitled "A Novel Power-Off Mode for a Battery-Backup DRAM", *Symposium on VLSI Circuits Digest of Technical Papers*, 1995, pp. 109–110, is to completely turn this Vwl power off. However, this approach has a disadvantage since the system would take a long period of time, e.g., in the range of 10 μs, to return back to the active mode, or prior to conducting a refresh. This may not be practical, when the eDRAM memory is used and periodical refresh is required. An intuitive approach is to use a lower-power standby pump other than the active pump. Whenever the chip enters the low-power mode, the active pump components are shut off, and only the stand-by pumps remain on to keep the voltage level. This approach however, also has some disadvantages, for example, extra hardware are needed to be built on the expensive chip real estate. These standby pumps are normally weak and not efficient, or less useful during the active mode operation. Besides, these stand-by pumps still consume energy during the low-power mode.

Further, array body bias voltage (Vbb) generators are used in today's memory chips to supply a voltage for biasing the substrate body in which the active devices are formed. That is, this Vbb voltage is applied to the body of the transfer device of the DRAM array. Vbb is used to block the device sub-threshold leakage by boosting device threshold voltage.

As shown in FIG. 1, each generator 10, Vwl or Vbb, comprises a limiter circuit 12 and an oscillator circuit 15 for generating clock pulse for powering a charge pump circuit 18. The charge pump of each respective generator will then pump the output level 19 of each generator from a first level to a second level. The limiter device 12 is provided to detect whether the output voltage 19 has reached to the targeted second level or not. If it does, then the limiter device 12 will shut off the pump and stop pump operation. Inside each pumps there are at least two boost capacitors (not shown). For example, in a two-stage pump, then about 4 to 6 boost capacitors are presented. These boost caps are used to assist charge pumping. Details of operation are well known to skilled artisans. A decoupling capacitor is also provided for the Vwl generator which is a capacitor connected to its output bus. For example, a 3 nF to 20 nF of decoupling capacitor may be needed for Vwl bus of a DRAM with varying density. It should be understood that the Vbb is the p-WeLL bias voltage, and is already tied to a huge pWell of the DRAM array, therefore, no decoupling capacitor is needed. The decouple capacitor is used to stabilize the output voltage 19 and avoid any coupling effect by other voltage levels.

It would be highly desirable to provide an improved low-power semiconductor memory chip voltage generator design that provides for the switched connection of individual Vbb and Vwl (or Vneg) generators and, the simultaneous turning on of these generators when connected during a power-on operation in order to speed the power on process.

It would additionally be highly desirable to provide an improved, low-power semiconductor memory chip voltage generator design that additionally provides for the separation of switch connected individual Vbb and Vwl (or vneg) generators to avoid any cross-over noise and permit different voltage level outputs during an active mode of operation.

It would additionally be highly desirable to provide an improved low-power semiconductor memory chip voltage generator design that provides for the switched connection of Vbb and Vwl (or Vneg) busses, with the Vwl generator being turned off to save energy during the sleep mode of operation, and obviating the need for a stand-by negative word-line (Vwl) generator system.

SUMMARY OF THE INVENTION

It is an object of the present invention to provide an improved low-power semiconductor memory chip voltage generator system that provides for the switched connection of individual Vbb and Vwl (or Vneg) generators and, the simultaneous turning on of these generators when connected during a power-on operation in order to speed the power on process.

It is a further object of the present invention to provide an improved, low-power semiconductor memory chip voltage generator system that additionally provides for the separation of switch connected individual Vbb and Vwl (or Vneg) generators to avoid any cross-over noise and permit different voltage level outputs during an active mode of operation.

It is another object of the present invention to provide an improved low-power semiconductor memory chip voltage generator system that provides for the switched connection of Vbb and Vwl (or Vneg) busses, with the Vwl generator being turned off to save energy during the sleep mode of operation.

It is yet another object of the present invention to provide a low-power voltage supply system for a memory chip device having a relaxed (or longer) sleep refresh duration time so that the energy required during the sleep/refresh may be easily supplied by a Vbb generator pump without causing any disturbance on the array substrate.

According to the invention, there is provided a low-power voltage supply system and method for a memory device comprising a semiconductor substrate array of memory cells, wherein the system comprises: a negative word-line (Vwl) generator device for supplying first (word-line) voltage at an output thereof for selecting memory cells in a memory device; an array body bias voltage (Vbb) generator device for supplying second (back bias) voltage at an output thereof for biasing the substrate array in a memory device; and, a switch device for selectively connecting the negative word-line (Vwl) generator device output to the body bias voltage (Vbb) generator device output during one or more operating states of the memory device.

Preferably, during a power-on operative state for turning on the generator devices, the switch device couples the negative word-line (Vwl) generator device output to the body bias voltage (Vbb) generator device output in order to speed up the power-on process for the memory device.

Additionally, the low-power voltage supply system of the invention provides for the turning off of the negative word-line generator during a sleep/low-power mode of operation, with the switch shorting the negative word-line power supply to the substrate bias (or Vbb) voltage supply which is constantly supported by the Vbb generators. During the low-power mode, although the chip temperature may drop, the memory chip would still consume some energy. For example, the negative word-line level (or Vneg) may drift higher if leakage exists, or a refresh cycle is needed. Therefore, it may not be left floating, or otherwise, the cells may leak if the Vneg becomes less and less negative. On the other hand, the substrate bias (or Vbb) generator is normally left on after the chip is powered on. The voltage level may or may not be identical to the negative word-line level. The Vbb level is determined by the optimum condition in which the cells have lowest leakage level. If Vbb is too high (or less negative), then the sub-threshold leakage level may be poor. But, if Vbb is too low (or more negative), the device junction leakage level will dominate. Nevertheless, the Vbb level is usually tracking with the Vneg level, and most of time their values are identical. Thus, in the active mode, the Vbb and Vneg supplies are separated, so as to avoid any cross-over noise between them. In the active mode, the wordlines may be accessed at a high frequency. As a result, the Vneg level is noisy or fluctuated. If both levels are shorted all the time, the Vbb level will also become noisy which could cause data loss or other unexpected and undesirable effects. This problem is obviated in the sleep mode, since no array activity other than occasional refresh is expected.

Implementation of the low-power voltage generation system and method of the invention are advantageous in that: (1) No extra hardware, e.g. no standby Vneg pumps are needed, which means smaller chip area; (2) A power saving in because Vneg is completely shut off resulting in no (zero) Vneg stand-by energy consumed; (3) No cross-over noise between Vbb and Vneg during the active operating mode since they are isolated, which means less noise; and (4) Design flexibility in that Vbb and Vneg level are enabled to be set slightly different. Furthermore, the principles and advantages of the invention may be applied to any two or more DC generator systems, negative or positive.

BRIEF DESCRIPTION OF THE DRAWINGS

Further features, aspects and advantages of the apparatus and methods of the present invention will become better understood with regard to the following description, appended claims, and accompanying drawings where:

DETAILED DESCRIPTION OF THE PREFERRED EMBODIMENTS

Figure 1:
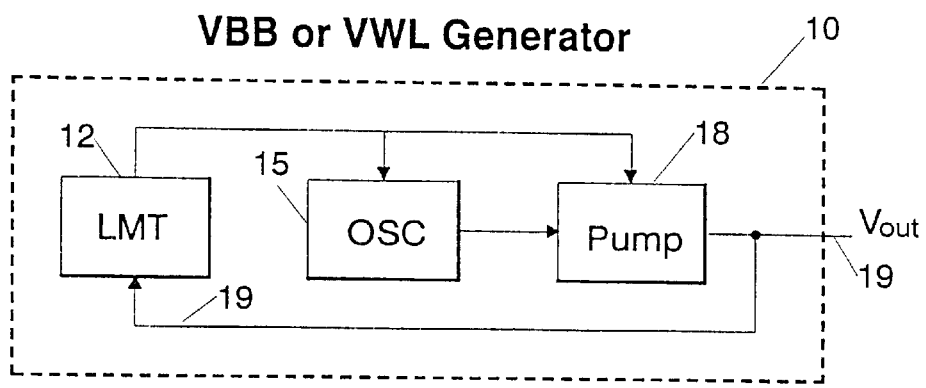
FIG. 1 depicts a typical Vwl and Vbb voltage generator circuit design.
Figure 2:
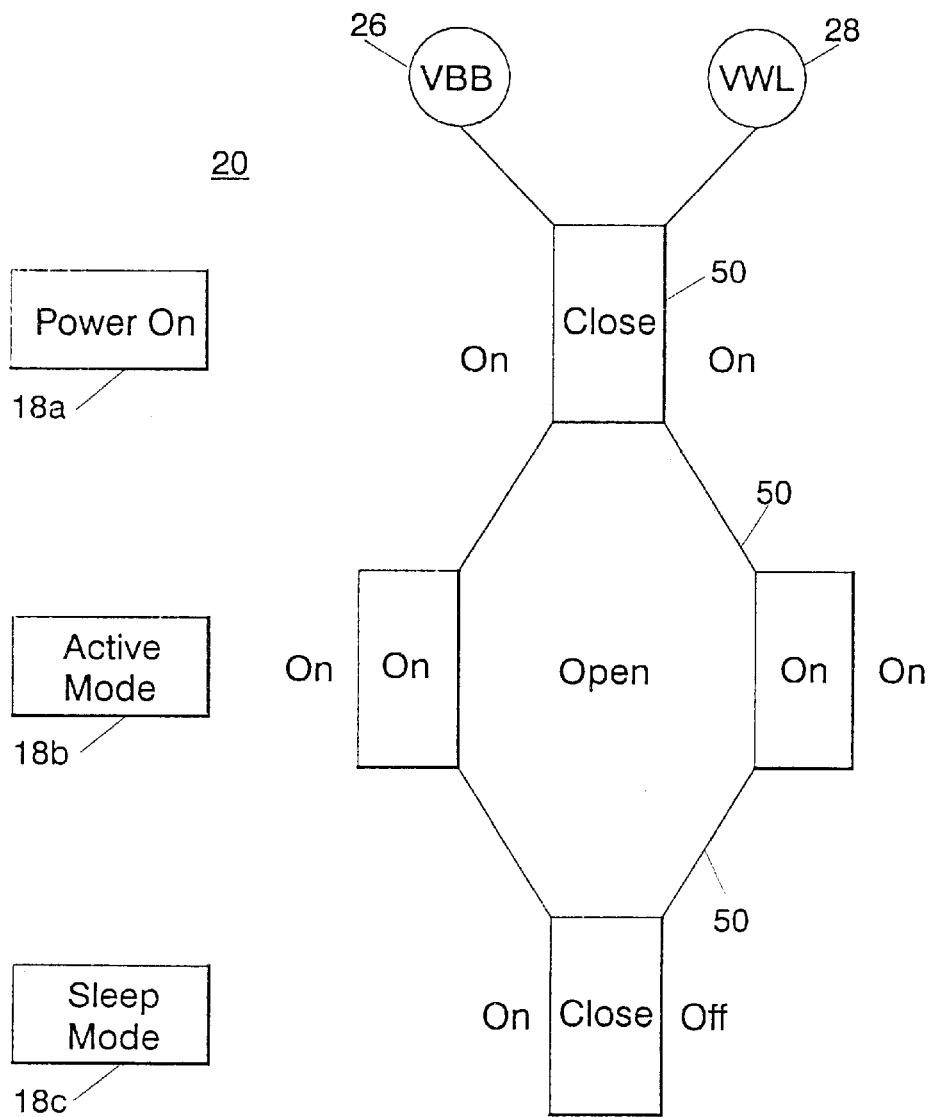
FIG. 2 is a conceptual block diagram depicting the improved low-power semiconductor memory chip voltage generator system including a low-power negative word-line (Vwl or Vneg) generator having different operating states according to the principles of the invention.

Conceptually, as illustrated in FIG. 2 the improved low-power semiconductor memory chip voltage generator system 20 comprises a negative word-line low Vwll voltage generator 28 and an array body bias voltage Vbb generator 26 that are designed such that: 1) during a power-on operation 18a, a switch 50 operates to short the Vbb and Vwl (or Vneg) generators 26, 28 with the design enabling their simultaneous turn-on in order to speed the power on process; 2) during an active mode of operation 18b, the switch 50 opens so that Vbb and Vwl (or Vneg) generators 26,28 separate in order to avoid any cross-over noise and allow different voltage levels during the active mode; and, 3) during a sleep mode of operation 18c, the Vbb and Vwl (or Vneg) power supply busses are connected, however, with the Vwl generator 28 being turned off in order to save energy. Each of these circuit configurations corresponding to the three modes of operation will be described in greater detail herein. Thus, as described herein, two negative pumps with similar output voltage levels can be integrated for power saving purposes. However, it is understood that, according to the principles of the invention, two or more DC generator systems, negative or positive, may be integrated to save power or, improve performance by sharing hardware.

Figure 3A:
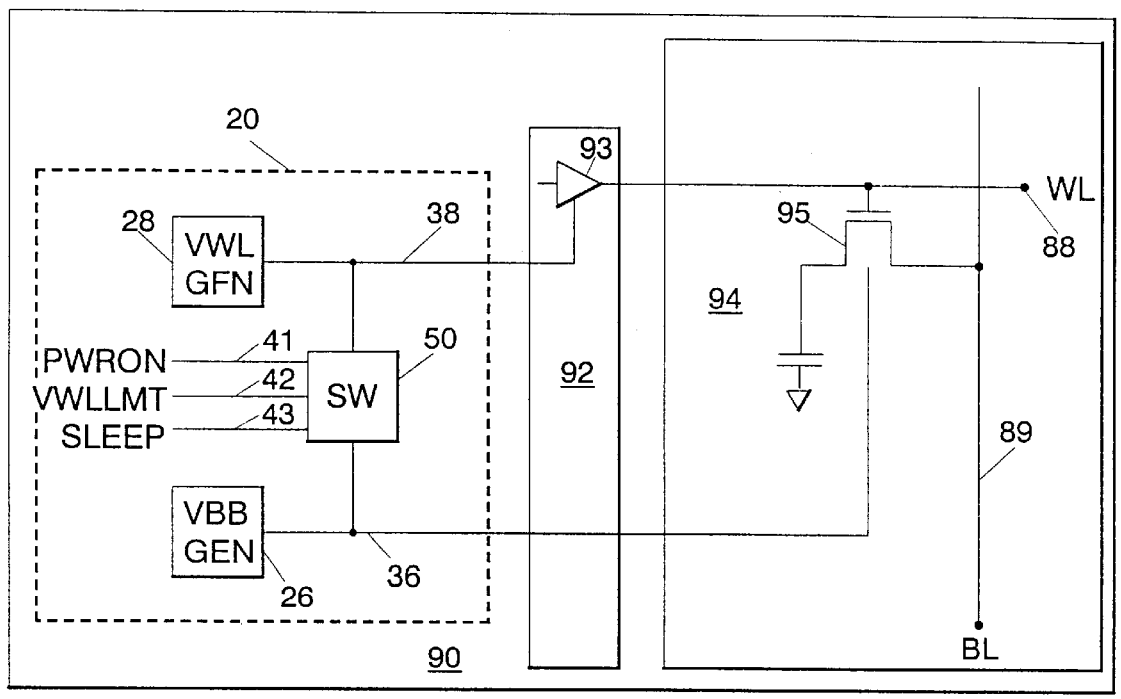
FIG. 3(a) is a detailed block diagram illustrating the implementation of the improved low-power semiconductor memory chip voltage generator system implemented for a memory device.
Figure 3B:
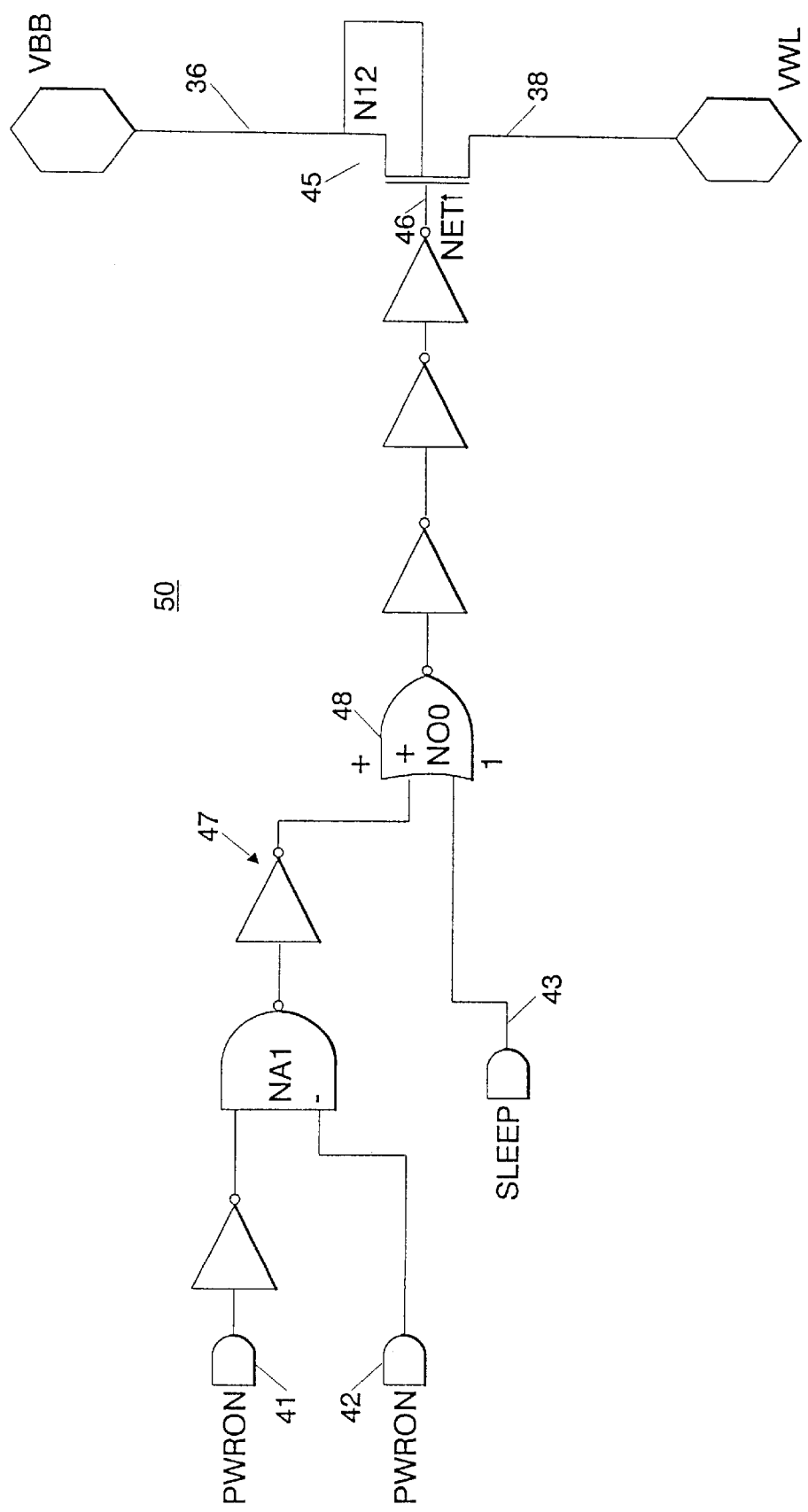
FIG. 3(b) is a detailed block diagram illustrating the switch circuit for connecting the Vbb and Vwl power supply generators according to the present invention.

FIGS. 3(a) and 3(b) illustrate the implementation of the low-power semiconductor memory chip voltage generator system 20 applied for a DRAM macro 90 comprising a decoder/driver circuitry 92 for driving a memory cell array 94. As shown in FIG. 3(a), the Vwl generator 28 includes output bus 38 carrying voltage to power a memory word-line driver 93 for providing a negative voltage for all the unselected word-line voltages 88 for each memory cell 95. Likewise, bit line drivers (not shown) are provided for selecting a bit-line 89 of a memory cell 95. The Vbb generator 26 includes output bus 36 carrying a back-bias voltage for each memory cell 95 as shown in FIG. 3(a). As further shown in FIG. 3(a), the output busses 36 and 38 are connected to a switch device 50 which provides the output bus coupling in accordance with the preferred embodiment of the invention as will be explained in greater detail herein.

The switch circuit schematic is illustrated in FIG. 3(b). The switch 50 itself is formed by a nMOS transistor device 45 having source and drain terminals directly connected to Vbb output bus 36 and Vwl output bus 38 for the respective Vbb and Vwl generators. Preferably, the nMOS transistor is a large width device having a channel length of 0.36 μm, for example. The gate 46 of the nMOS transistor is controlled by a logic circuit 47 comprising NAND, NOR and inverter gates which receive various inputs for controlling switching state of the device. The input signals to determine the switching state include:

(1) PWRON—the power on signal 41, i.e., during chip power on period (e.g., PWRON=0), to turn on all of the DC generators sequentially and in a specific order in order to avoid any latch-up situation. The PWRON signal is triggered (e.g., PWRON=1) when the power-on sequence is finished, i.e., when the power-on operation is done, the chip is ready for active mode operation. As described, the system of the invention advantageously exploits the strong Vwl pump during power on period to bring both VBB and VWL levels up quickly. In this case, when PWRON=0 during power on period, the gate of the switch must be turned on. On the other hand, when the power on is finished, the switch is opened to effectively isolate the Vbb bus and Vwl bus so that normal operation may take place and the occurrence of cross-noise between Vwl and Vbb being prevented.

(2) VWLLMT—the negative wordline limiter signal 42. The Vwl (negative wordline) generator has a limiter which limiter indicates whether the VWL generator is active or not. For example, when the Vwl level is reached, the pump is shut off, so that it will not overpump the system. Therefore, VWLLMT=0 means the level has reached, and pump should be stopped, otherwise, the pump will continue to bring the voltage level up. By the combination of PWRON=0, an VWLLMT=1, the input to the NOR gate 48 will be high, which continue to force the switch on. When the VWL level is reached, the switch 50 will be off (transistor 45 turned off), at this moment, the Vwl level will be idled, since its pump is off, but the Vbb level continue to be active and supported by the Vbb pump. The reason is Vbb comprises a huge capacitor which requires a little longer time than Vwl network to be fully charged up. Thus, the switch is disengaged when the Vwl level is reached, i.e., VWLLMT=0. This arrangement may be used for pumping two different voltage levels, when the first level is reached one pump is off, and the other pump continues to pump to the second level.

(3) SLEEP—the signal 43 for indicating that the sleep mode is on. At this point, irregardless of the PWRON and VWLLMT signals, the switch 50 is forced on when SLEEP=1. At this moment, the Vwl pumps are completely disable to save power, since the generator is no longer in active operation. Further, the Vwl network is supported by the weak Vbb pump. During sleep, the Vwl may need charge replenish, since leakage still occur. This arrangement will save a standby Vwl pump.

With respect to a conventional memory device power-on sequence, the Vbb generator is switched on with a high speed oscillator. The Vbb generator pump does not stop until Vbb level reaches to its target level. Then, a Vpp voltage (not shown) is turned on. After Vpp reaches about 1V volts, the Vwl generators are turned on. This conventional sequence is arranged in such a way to avoid any detrimental effect, such as to avoid forward biasing a device's junction and cause circuits to latch-up. However, it is known that the Vbb voltage ramp up time is relatively long, in the range of 50 $\mu$s. It is not only because Vbb pumps are weak, but also Vbb level is coupled up by Vpl (memory cell plate voltage), since plate voltage supply is ramped up simultaneously. It is the case that a DC generator design between eDRAM and stand-alone DRAM are somewhat different. For example, in the eDRAM design, the Vpl is tied to ground, therefore, the Vbb coupling-up effect does not exist. The Vbb parasitic capacitance is also not very big since the macro size is relatively small (e.g., 4 Mb or 8 Mb).

According to the invention, however, in the power-on mode 18a, the Vbb and Vwl voltages are merged together during power-on in order to shorten the power-on process. In order to do that, the Vpp must also ramp up simultaneously to about 1V. This is because, all the p-wells tied to Vwl are isolated by n-wells which are tied to Vpp. It is safe that Vpp be powered up to certain positive voltage level while ramping up the Vwl. During power-on, since Vwl and Vbb are shorted to each other, one of each pump are turned on. The Vwl and Vbb pumps are designed differently, for example, the former has a bigger reservoir capacitor (e.g., four times bigger) and powered by a faster oscillating speed (35.5 MHz vs. 7.75 MHz, for example). Similar to that of the Vpp, Vwl has a high-speed limiter. The Vbb's limiter is intentionally designed to operate with a slow speed to save energy and thus its response time is in the range of 1000 ns. The capacity of a Vbb pump is about 0.2 mA, but for a Vwl pump is more than 2.1 mA. The pump circuit for both Vbb and Vwl are basically the same, the pumping efficiency is in the range of 75% for both. The switch used to short Vbb and Vwl supplies is activated during the power-on period until Vwl level is reached. Additionally, during sleep mode, the switch 50 is always on so that Vwl supply is from Vbb.

Example Vbb/Vwl waveforms during an example system power-on simulation are shown in FIGS. 4(*a*) and 4(*b*). Specifically, FIG. 4(*a*) illustrates the nearly identical ramp-up times for the Vbb bus voltage output 36 and Vwl bus voltage output 38 in accordance with the present invention. FIG. 4(*b*) is a timing diagram depicting the signals utilized during power on operation resulting in the simulation result waveforms of FIG. 4(*a*). It is understood that during power-on, the Vbb and Vwl are joined only when Vwl is below a target limit. As shown in FIG. 4(*b*), it takes less than 1.1 $\mu$s for Vwl to reach that target voltage level 60, as depicted FIG. 4(*a*), for example. At that point, the VWLLMT signal 42 in FIG. 4(*b*), triggers, and the switch device 46 is opened to isolate the Vwl and Vbb generators. As shown in FIG. 4(*b*), an oscillator signal 42' is input to the Vwl charge pump of the Vwl generator during the power on-sequence, i.e., when VWLLMT 42 is active. Additionally, depicted in FIG. 4(*b*) is the VBBLMT signal 44 for the Vbb generator and its corresponding oscillator signal 44' for the Vbb generator charge pump which becomes active during the power-on sequence after the Vwl generator pump. As shown, the oscillator signal 44' for the Vbb generator is a much lower frequency than the corresponding oscillator 42' for the Vwl pump. The Vbb and Vwl supplies are intentionally made leaky in the example simulation to mimic a potential real-life situation. In this example simulation, the Vbb final level being simulated is at −0.56V, while Vwl is at −0.48V, although both targets are set at −0.5V. The Vbb is slower due to the weakness of the Vbb charge pump and its larger capacitive load.

That is, as explained earlier, Vbb and Vwll are saturated at different levels due to different limiter speeds. Thus, as shown in FIG. 4(*a*), some overshooting on the Vbb level may be desirable. Generally, it may take longer time to charge up resistive Vbb capacitors than as shown in the simulation depicted in FIG. 4(*a*). The amount of Vbb overshooting depends on: 1) the speed of limiter; 2) the differential amplifier response time; and 3) on the driver chain delay. The reason there is a long driver chain with loaded capacitors for a Vbb limiter is to remove the glitches so that the Vbb limiter signal will be free of noise. An example total time delay computed by adding up herein mentioned items 1, 2 and 3 is about (276 ns+407 ns+487 ns) 1170 ns. The amount of Vbb overshooting is also determined by the Vbb pumping rate and Vbb loading. For a single Vbb pump to turn on with an oscillating frequency of 7.5 MHz, the pumping rate is about 36 uV/ns. This will result in Vbb level to be saturated at about −0.56V. Overshooting of Vbb may have an advantage for the joint Vbb/Vwl approach. During the sleep mode when Vwl pumps are completely shut off, by merging Vwl to Vbb, the Vwl level may also become slightly lower and this may sustain a few refresh cycles without requiring Vbb pump to turn on.

Figure 4A:
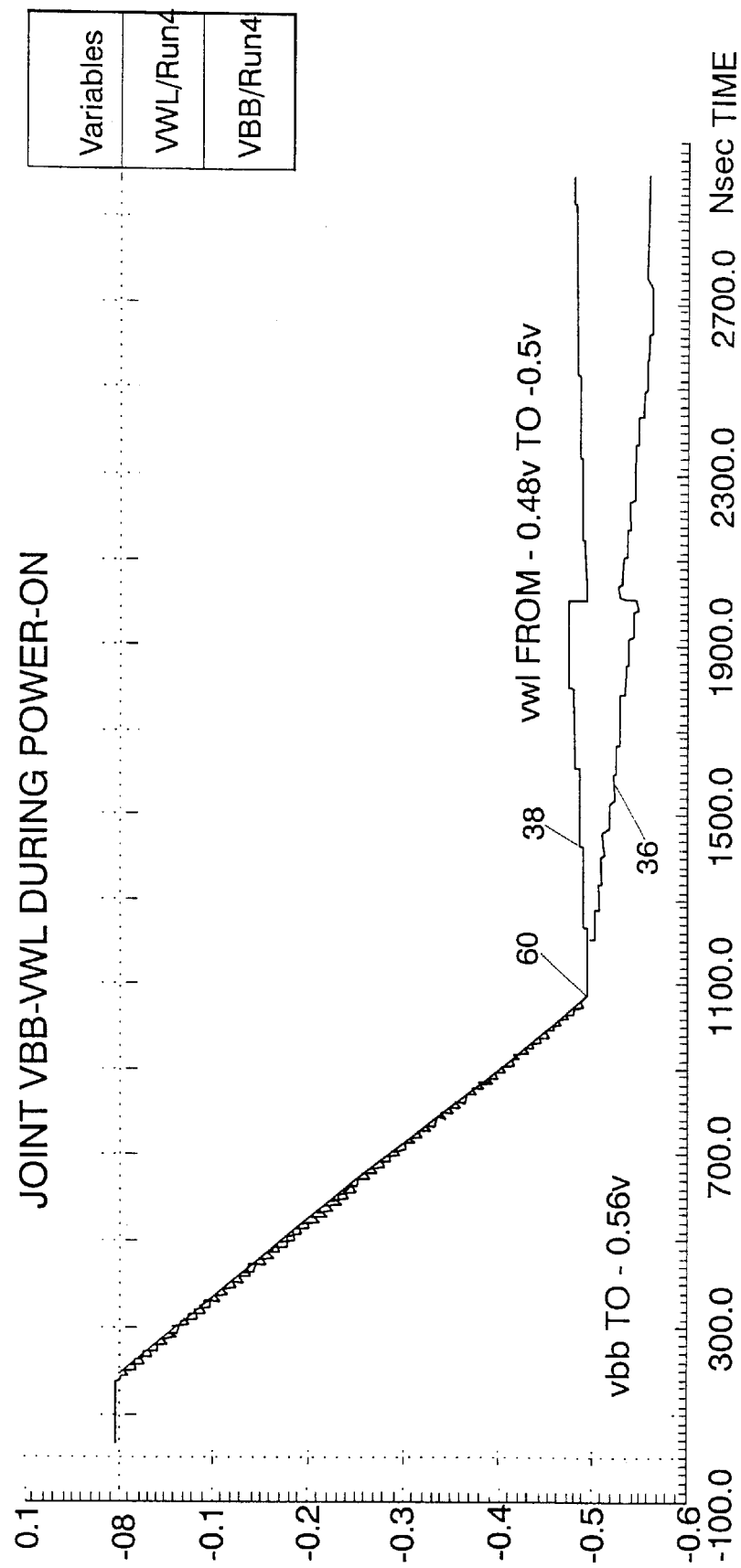
FIG. 4(a) is a diagram illustrating the Vbb/Vwl output voltage waveforms during an example simulation of the power-on mode.
Figure 4B:
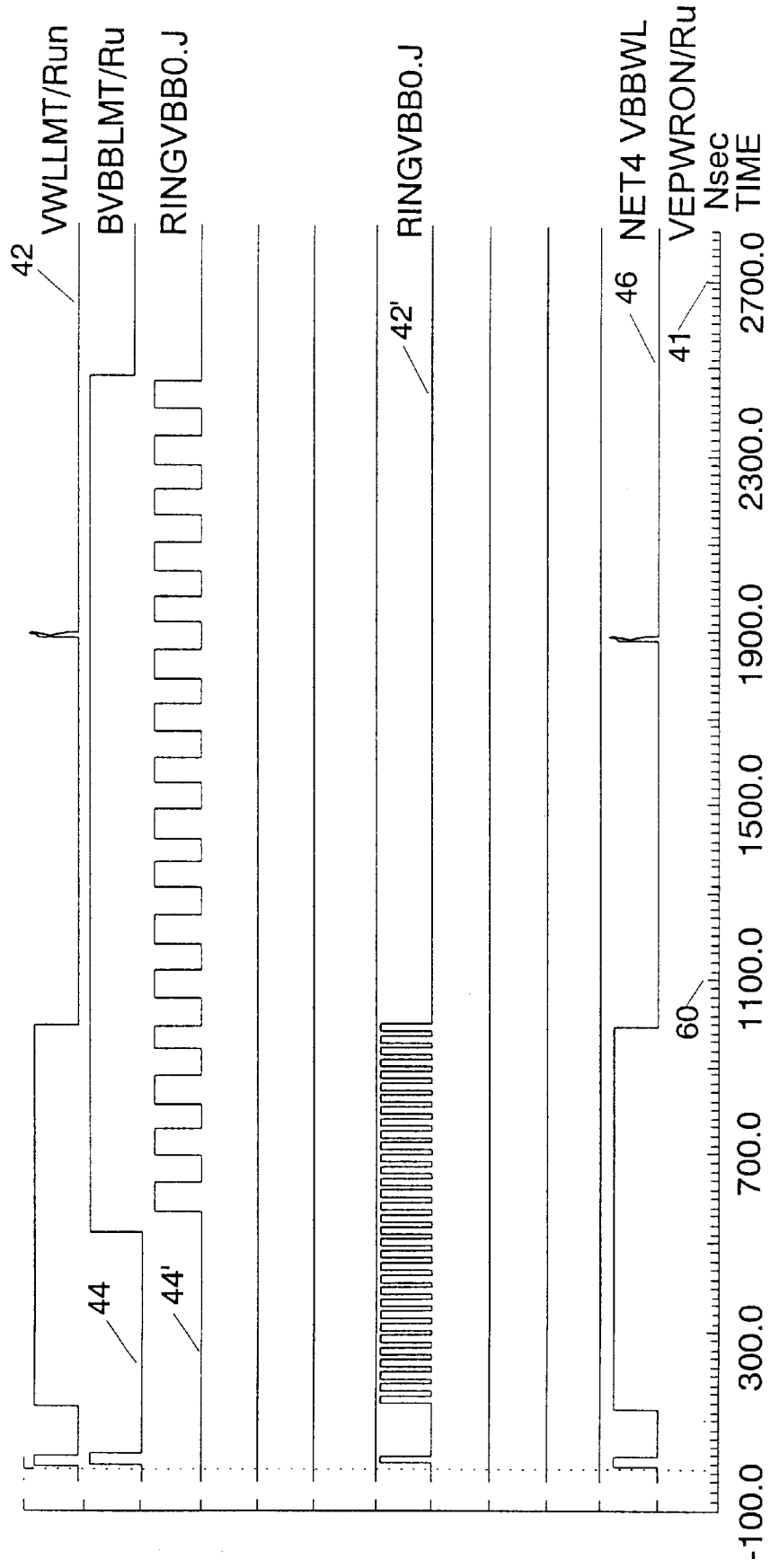
FIG. 4(b) is a timing diagram of signals utilized during power on operation resulting in the simulation result waveforms of FIG. 4(a).

During the active mode of operation 18b, Vbb and Vwl are separated with each generator being activated separately. FIGS. 4(a) and 4(b) illustrate the simulation results given a 20 ns word-line (WL) cycle time operation. The estimated Ipp current needed for the macro during this period is 0.81 mA. For example, 3 WLs are on simultaneously, with a total load of 1.5 pF and a voltage swing of 3.6V (from −0.5V to 3.1V). It is assumed that the major portion of current from Vpp will be drained by Vwl supply. During this period, one Vwll pump is always on, the other three pumps will be automatically turned on based upon need. The Vwl pumps are operated at a speed of 35.5 MHz. The capacity of one Vpp pump is about 2.1 mA. Therefore, four (4) pumps are more than sufficient to drain 2 mA Ipp peak current. In the active mode, the capacity of Vwl pump is not a problem, but Vpp pump system is rather weak due to poor pumping efficiency caused by low Vdd (1.8V) supply. To keep Vwl swing within +/−5%, a large de-cap is needed. For example, a 2.4 nF capacitive load may be used. Unlike Vbb, Vwl has a high-speed limiter similar to that of Vpp. This is why the fluctuation range of Vwl is much tighter than that of Vbb.

Figure 5A:
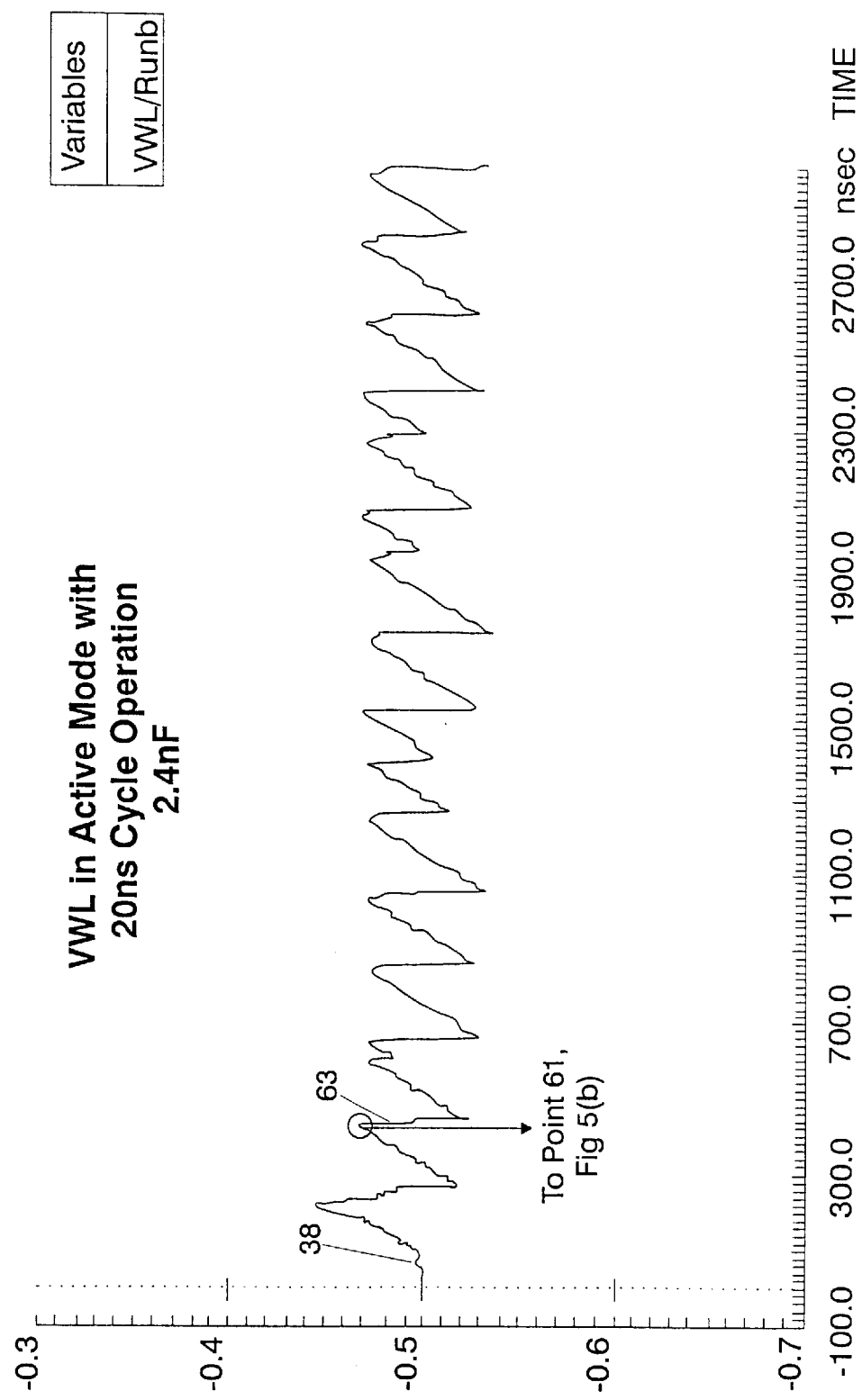
FIG. 5(a) is a diagram illustrating the Vwl output voltage waveform during an example simulation of the active mode.
Figure 5B:
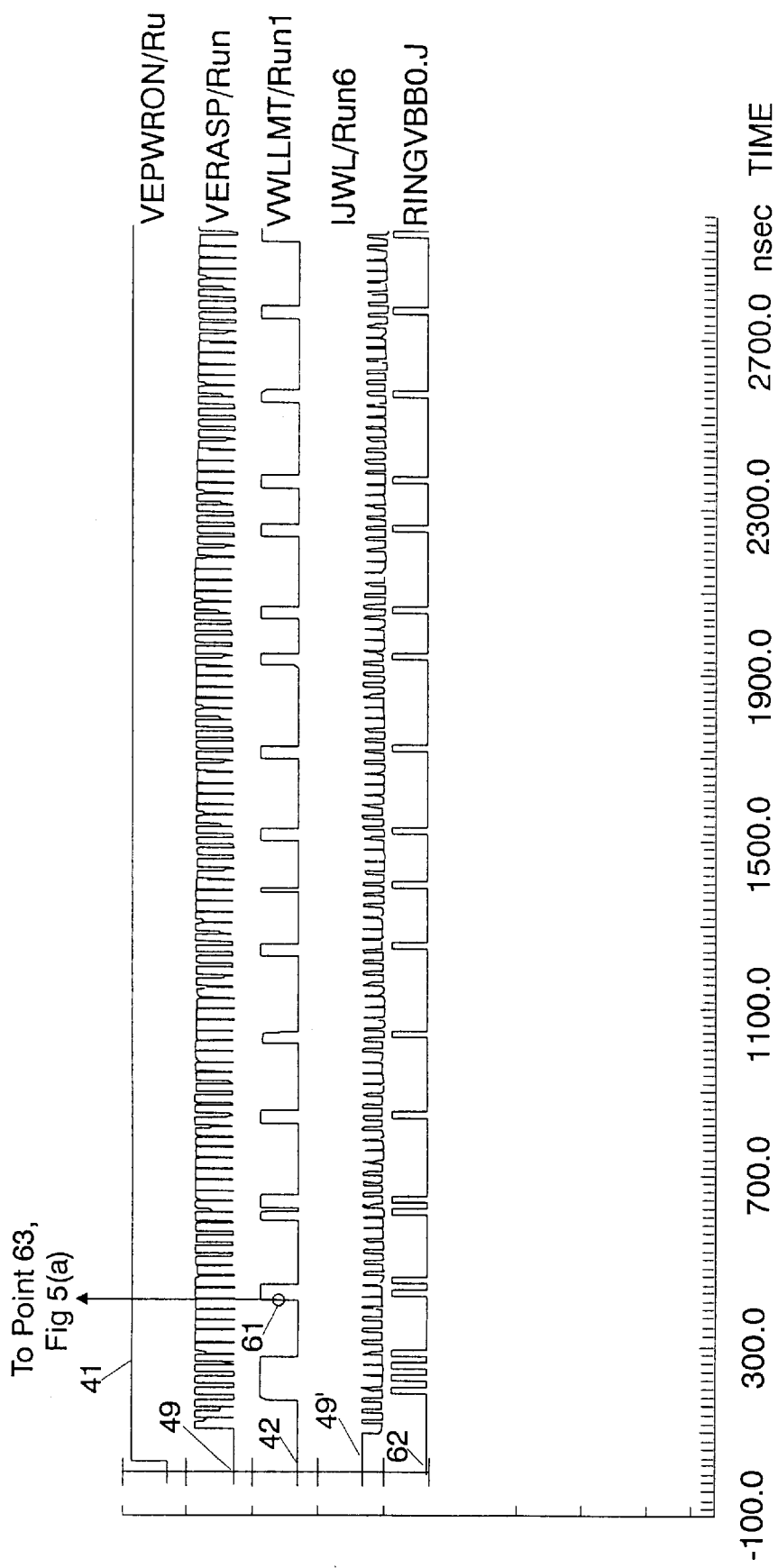
FIG. 5(b) is a timing diagram of signals utilized during active mode operation resulting in the simulation result waveform of FIG. 5(a).

Example Vwl waveforms during an example active system mode simulation are shown in FIGS. 5(a) and 5(b). In the active mode, as shown in FIG. 5(b), the VPWRON signal 41 is high (=1). In the example simulation, there is continuous pulse word-line (array) activation as indicated by row/address activation (RAS) signal 49 and the Vwl generator is the means by which these RAS signals are sourced. The Vwl generator additionally functions as a sink for the corresponding Vpp current as represented by the IJVWL signal 49' or word-line swing signals. Thus, during active mode, due to the current drawn during the drawn from the continuous array activation, the Vwl charge pumps are activated in response to activation 61 of the VWLLMT signal 42 as shown in FIG. 5(b). Corresponding to the activation of the VWLLMT signal 42, the oscillator signal 62 is active for the pumping up the Vwl voltage. As shown in FIG. 5(a), in response to VWLLMT signal 42 activation 61, the Vwl starts increasing (more negative) at 63. Although in the example simulation the Vwl output bus is tied to a decoupling capacitor of 2.4 nF, the Vwl voltage 38 exhibits ringing which fluctuates at about −0.5+/−10%. It is understood that, for some circuit designs, this may be acceptable.

Figure 6A:
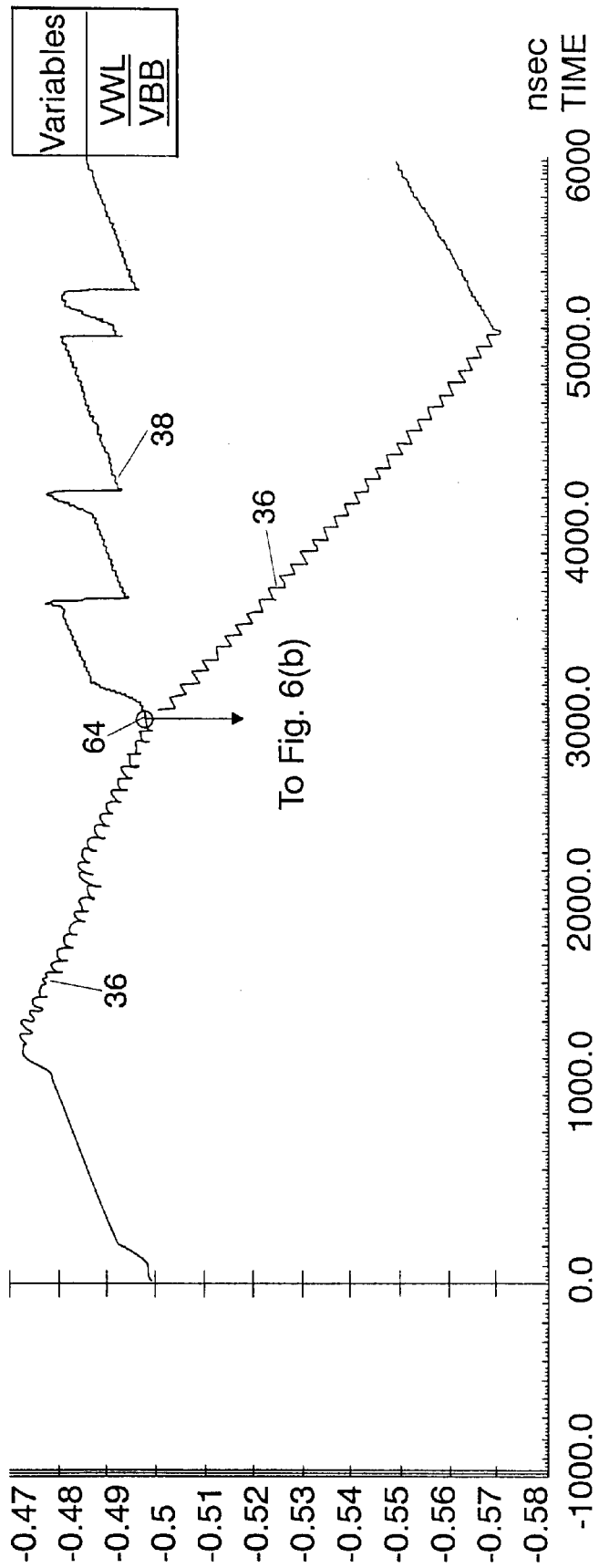
FIG. 6(a) is a diagram illustrating Vbb/Vwl voltage waveforms during an example simulation of the sleep and refresh modes.
Figure 6B:
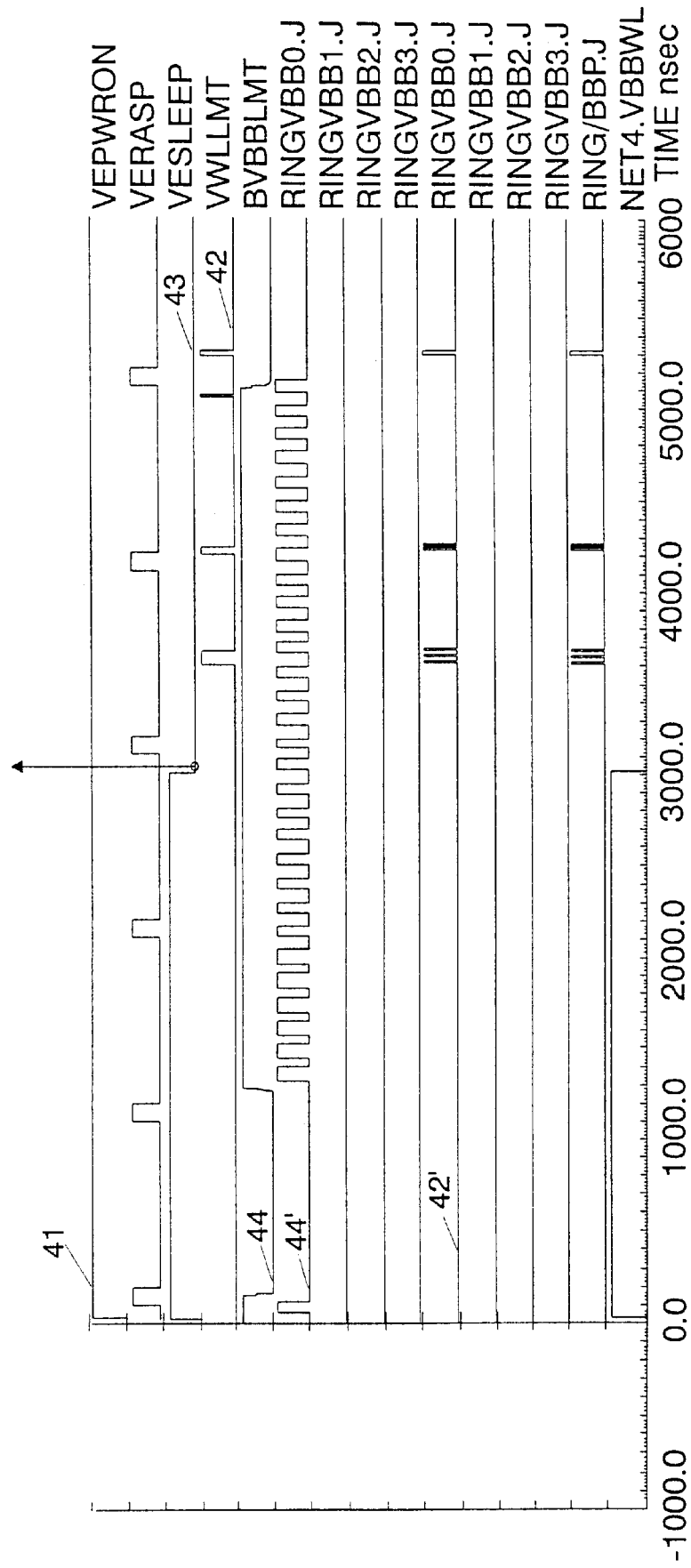
FIG. 6(b) is a timing diagram of signals utilized during sleep and refresh modes resulting in the simulation result waveforms of FIG. 6(a).

Example Vbb/Vwl waveforms during an example system sleep mode simulation are shown in FIGS. 6(a) and 6(b). Specifically, during the sleep mode, the VSLEEP signal 43 is active (=1) to turn on the switch device 50. However, as shown in FIG. 6(a), only the Vbb voltage output 36 is available as the Vwl generator is turned off. The Vwl 38 and Vbb 36 levels are disjoined again at a time indicated at 64 by the switch device 50 in response to the VSLEEP signal 43 being turned off. As shown in FIG. 6(b), however, during active mode, the Vwl pumps are switched on to meet the high capacity requirement. That is, VLLMT signal 42 and corresponding oscillator signals 42' are turned on in order to maintain the Vwl voltage at its target level.

During sleep mode of operation 18c, the Vwl generator is completely shut off to save Vwl standby power of about 156 uA. To achieve this, the Vwl busses are shorted to those of the Vbb. Therefore, Vbb generator will have to provide current to sustain not only Vbb leakage, but also the refresh current from Vwll. The refresh pulse duration is targeted at 100 ns. Therefore, the average current required during refresh is about 0.2 mA, and on e Vbb pump is sufficient. The Vbb limiter 44 will kick the Vbb pump on when Vbb level reaches −0.48V. The average pumping rate for a single VBB pump is about 40 uV/ns. According to one estimation, the maximum refresh cycle time in the sleep mode at 40 degree C is about 1500 ns. In the example simulation depicted, a 1000 ns cycle is used. It is estimated, due to high Vbb pumping efficiency, during the sleep mode, one Vbb pump is sufficient to keep both Vbb and Vwll level. In the waveform shown in FIG. 6(a), the sleep mode starts at 10 ns and ends at 3000 ns. At this moment, only Vbb oscillator 44' is on. However, when the sleep mode is over, the Vbb and Vwl are separated, and Vbb is pumped down continuously to −0.57V due to the aforementioned delay. The Vbb level fluctuates between −0.47V and −0.57V. However, the Vwl due to its faster response speed has a fluctuation range of about −0.48V to −0.5V. During active mode, if the current demand is low then only one Vwl pump is on, or otherwise, four pumps may be on simultaneously.

An estimation of the coupling noise from bit lines to the wordline low level (or Vwl) is now provided using an existing eDRAM macro as an example:

(1) Assuming one-half (½) Vdd sensing, when one word-line of 1M array macro is selected. The worst case of coupling is when all the cells are stored with logic "zero" and are read from the cells of that wordline. So, one BL of each pair will swing from 0V to 180 mV, and the other BL stays at ½ Vdd. Therefore, total of 2048 BLs will swing from 0V to 180 mV within an approximate 2 nano-second signal development time period.

(2) These 2048 BLs will couple 512 (actually 511) of non-selected WLs up. The BL to passive WL coupling capacitance for each cell is about 0.065 nF, each 1M array has 512 WLs and 2048 pairs of Bls, therefore the total coupling capacitance 0.062 nF×2048×512=0.065nF approximately. The reason that 512 cells are used is to assume the worst case. That is, wire BL to wire WL coupling is the same as the coupling through device.

(3) The Vwl decoupling comprises not only the decoupling capacitor which is about 1.5 nF, but also the wordlines from each four macros that connect to the WLL busses. The total wordline capacitance of a macro is estimated as 0.206 fF/cell×2048×512=0.216 nF.

(4) The Vwl coupling noise may be estimated as 180 mV×(0.065 nF)/(0.065 nF+4×0.216 nF+1.5 nF).

Normally, if the cycle time is fast, for example 20 ns, then what is coupled up will be coupled down. The Vwll generators will not be able to response at this speed. However, in the active mode, when operating a long WL cycle, i.e., page mode operation, the four active Vwl low generators will bring the voltage to the target level before the WLL level gets coupled down. In the sleep mode, during the long refresh period (e.g. 200 nS), the Vbb pump is not able to bring the Vwl level down after it is coupled up. However, since Vwl is merged to Vbb, the enlarged decoupling capacitance may further reduce the noise to only about 24 mV. Eventually, the Vwl level will be restored when all the BLs return to ground. The VWL generators preferably have sufficient power to overcome the coupling and keep cell leakage current low.

With the low-power word line low generator design in accordance with present invention, the Vbb and Vwl generator standby power from is reduced approximately from about 186 uA to about 10 uA. This is a significant energy saving especially for battery-supported (i.e., handheld) embedded applications. Moreover, there is virtually no waiting time required to get system back to normal active mode.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims. Thus, while the invention is described herein is directed to shared Vbb and Vwl shared negative voltage pump system voltages for DRAM memory circuits in order to boost performance, reduce power and avoid possible noise coupling effect, the same concept may be applied to any other two or more pump systems.

Having thus described our invention, what we claim as new, and desire to secure by Letters Patent is:

1. A low-power voltage supply system for a memory device comprising a semiconductor substrate array of memory cells, said system comprising:
   a negative word-line (Vwl) generator system for supplying first (word-line-low) voltage at an output thereof for de-selecting memory cells in said memory device;
   an array body bias voltage (Vbb) generator system for supplying second (back bias) voltage at an output thereof for biasing said substrate array in said memory device; and,
   switch device for selectively connecting said negative word-line (Vwl) generator system output to said body bias voltage (Vbb) generator system output during one or more operating states of said memory device.

2. The low-power voltage supply system for a memory device as claimed in claim 1, wherein, during a memory device active state, said switch device automatically decouples said negative word-line (Vwl) generator system output from said body bias voltage (Vbb) generator system output for enabling independent negative word-line (Vwl) generator system and body bias voltage (Vbb) generator system operation.

3. The low-power voltage supply system for a memory device as claimed in claim 1, wherein said memory device implements a refresh during an active mode of operation, the Vwl voltage generator system being switched on to meet high capacity loading requirements during said active mode.

4. The low-power voltage supply system for a memory device as claimed in claim 1, wherein, during a sleep mode of operation, said switch device separates said negative word-line (Vwl) generator system output from said body bias voltage (Vbb) generator system output.

5. The low-power voltage supply system for a memory device as claimed in claim 4, wherein, during a sleep mode of operation, said negative word-line generator system is turned off to save energy during said sleep mode, said body bias voltage generator system output providing said Vwl voltage for said memory device during said sleep mode of operation.

6. The low-power voltage supply system for a memory device as claimed in claim 1, wherein said negative word-line (Vwl) generator system and said body bias voltage (Vbb) generator system each comprise a respective limiter circuit, a charge pump circuit and an oscillator circuit for generating clock pulse for powering said charge pump of each respective generator to increase respective Vwl and Vbb output voltage level, said limiter circuit of said Vbb generator intentionally operating at a slow speed with respect to limiter circuit of said Vwl generator to save energy.

7. The low-power voltage supply system for a memory device as claimed in claim 6, wherein an operating frequency of said oscillator for said negative word-line (Vwl) generator system is greater than an operating frequency of said oscillator for said body bias voltage (Vbb) generator system.

8. The low-power voltage supply system for a memory system as claimed in claim 1, wherein, during a power-on operative state for turning on said generator systems, said switch device couples said negative word-line (Vwl) generator system output to said body bias voltage (Vbb) generator system output to speed up a power-on process for said memory device.

9. The low-power voltage supply system for a memory device as claimed in claim 8, wherein said switch device used to short Vbb and Vwl generator systems is activated during the power-on period until a Vwl target voltage level is reached.

10. The low-power voltage supply system for a memory device as claimed in claim 9, wherein said Vbb and Vwl voltage generators exhibit substantially identical ramp-up times until achieving said Vwl target voltage level during said power-on condition.

11. A method for providing voltages to a memory device comprising a semiconductor substrate array of memory cells, said method comprising:
   a) supplying a first (word-line) voltage at an output of a negative word-line (Vwl) generator system for selecting in memory cells in said memory device;
   b) supplying a second (back bias) voltage at an output of an array body bias voltage (Vbb) generator system for biasing said substrate array in said memory device; and,
   c) selectively connecting said negative word-line (Vwl) generator system output to said body bias voltage (Vbb) generator system output during one or more operating states of said memory device.

12. The method as claimed in claim 11, wherein, during a memory device active state, said step c) includes automatically decoupling said negative word-line (Vwl) generator system output from said body bias voltage (Vbb) generator system output for enabling independent negative word-line (Vwl) generator system and body bias voltage (Vbb) generator system operation.

13. The method as claimed in claim 11, wherein said memory device implements a refresh during an active mode of operation, wherein said step c) further includes the step of switching on said Vwl voltage generator system to meet high capacity loading requirements during said active mode.

14. The method as claimed in claim 11, wherein, during a power-on operative state for turning on said generator systems, said step c) includes coupling said negative word-line (Vwl) generator system output to said body bias voltage (Vbb) generator system output to speed up a power-on process for said memory device.

15. The method as claimed in claim 14, further including activating said switch device for shorting said Vbb and Vwl generator systems during the power-on period until a Vwl target voltage level is reached.

16. The method as claimed in claim 14, wherein said Vbb and Vwl voltage generators exhibit substantially identical ramp-up times until achieving said Vwl target voltage level during said power-on condition.

17. The method as claimed in claim 11, wherein, during a sleep mode of operation, said step c) includes coupling said negative word-line (Vwl) generator system output to said body bias voltage (Vbb) generator system output.

18. The method as claimed in claim 17, wherein, during said sleep mode of operation, the step of terminating operation of said negative word-line generator system to save energy during said sleep mode, said body bias voltage generator system output providing said Vwl voltage for said memory device during said sleep mode of operation.

* * * * *